(12) United States Patent
Kang et al.

(10) Patent No.: US 7,378,230 B2
(45) Date of Patent: May 27, 2008

(54) PHOTORESIST COMPOSITION FOR MULTI-MICRO NOZZLE HEAD COATER

(75) Inventors: Sung-Chul Kang, Yongin (KR); Jin-Ho Ju, Seoul (KR); You-Kyoung Lee, Suwon (KR); Dong-Ki Lee, Seoul (KR); Hyo-Youl Kim, Suwon (KR); Hoon Kang, Seoul (KR); Seung-Uk Lee, Seoul (KR); Byung-Uk Kim, Hwaseong (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/750,845

(22) Filed: Jan. 5, 2004

(65) Prior Publication Data

US 2004/0144753 A1    Jul. 29, 2004

(30) Foreign Application Priority Data

Jan. 3, 2003    (KR) .................... 10-2003-0000270

(51) Int. Cl.
*G03F 7/32* (2006.01)
*G03F 7/023* (2006.01)

(52) U.S. Cl. .................... 430/326; 430/191; 430/192; 430/193; 427/57; 427/240; 427/241; 427/346

(58) Field of Classification Search ................ 430/189, 430/191, 192, 193, 165, 166, 326, 270.1; 427/57, 240, 241, 346; 27/240
See application file for complete search history.

(56) References Cited

U.S. PATENT DOCUMENTS

| | | | | |
|---|---|---|---|---|
| 5,324,620 A | * | 6/1994 | Ebersole | ............. 430/192 |
| 5,346,799 A | * | 9/1994 | Jeffries et al. | ............. 430/192 |
| 5,853,949 A | * | 12/1998 | Kodama et al. | ............. 430/191 |
| 6,117,610 A | * | 9/2000 | Sheriff et al. | ............. 430/190 |
| 6,159,656 A | | 12/2000 | Kawabe et al. | |
| 6,232,031 B1 | * | 5/2001 | Gracia et al. | ............. 430/165 |
| 6,265,135 B1 | | 7/2001 | Kodama et al. | |
| 6,410,204 B1 | | 6/2002 | Kodama et al. | |
| 2002/0009666 A1 | | 1/2002 | Sato et al. | |
| 2002/0051933 A1 | | 5/2002 | Kodama et al. | |
| 2002/0058200 A1 | | 5/2002 | Fujimori et al. | |
| 2002/0061464 A1 | | 5/2002 | Aoai et al. | |
| 2002/0102491 A1 | | 8/2002 | Kodama et al. | |
| 2002/0155383 A1 | | 10/2002 | Fujimori et al. | |

FOREIGN PATENT DOCUMENTS

| | | |
|---|---|---|
| CN | 1224858 | 8/1999 |
| JP | 2000112120 | 4/2000 |
| JP | 2004213013 A * | 7/2004 |
| KR | 1020020079413 | 10/2002 |

OTHER PUBLICATIONS

BYK-307, BYK-333 and BYK-344 product list from www.BYK-Chemie.com for the ingredients in the commercial products.*

* cited by examiner

*Primary Examiner*—John S. Chu
(74) *Attorney, Agent, or Firm*—Cantor Colburn LLP

(57) ABSTRACT

The present invention relates to a photoresist composition for an MMN (multi-micro nozzle) head coater, more particularly to a photoresist composition comprising a novolak resin with a molecular weight ranging from 2000 to 12,000, a diazide photoactive compound, an organic solvent, and a Si-based surfactant for use in liquid crystal display circuits.

The photoresist composition for liquid crystal display circuits of the present invention solves the stain problem, which occurs in MMN head coaters used for large-scale substrate glass, and improves coating characteristics, so that it can be utilized industrially and is expected to significantly improve productivity.

9 Claims, 4 Drawing Sheets

20

40

Hole

PHOTORESIST COMPOSITION FOR MULTI-MICRO NOZZLE HEAD COATER

BACKGROUND OF THE INVENTION (a) Field of the Invention

The present invention relates to a photoresist composition for an MMN (multi-micro nozzle) head coater, and more particularly to a photoresist composition with improved uniformity and less stain problem which is suitable for an MMN coater for large-scale glass of the 5th generation line and that contributes to improvement in productivity and product quality.

(b) Description of the Related Art

With the increase of demand for LCD panels, especially for panels for TVs and monitors, larger glass and finer panels are required. With this trend, development of a new photoresist requiring new process conditions is needed. The photolithographic process on large-scale glass is an important process that determines line productivity. Of the coating characteristics of the photoresist film, presence of stains, contrast, resolution, adhesion to the substrate, materials remaining on the film, and so forth directly affect the qualities of circuits formed during the later etching process. Particularly, stains formed after the photoresist is coated using a coater during the photolithographic process become the cause of poor coating and CD uniformity. It remains after the PR (photoresist) has been stripped during the etching process, and thus reduces the productivity of LCD panels and lowers the product quality. For an MMN coater used in a photolithographic process for large-scale glass, the problem is more severe and a new type of stain is formed.

The MMN coater was brought into use for the following reason.

To coat a 1,100×1,250 mm glass used in the 5th generation line by a single scan, a new type of multi-micro nozzle (MMM) head is required. The nozzle has a length of 1,100 mm, with holes having a diameter of 80 μm and a pitch of 0.3 mm. The PR is sprayed through the holes of the nozzle (see FIG. 1).

This type of nozzle has the following advantages over the conventional slit & spin method: gap control between the glass and the nozzle is easy; and a waste of the PR can be greatly reduced.

However, if the PR is coated using the MMN head, a variety of stains are formed. The most troublesome among them are central stain, lateral stain, and cloudy stain (see FIG. 2).

SUMMARY OF THE INVENTION

It is an object of the present invention to provide a photoresist composition with improved uniformity and less stain problem which is suitable for an MMN coater for large-scale glass of the 5th generation line and that contributes to improvement in productivity and product quality.

It is another object of the present invention to provide a pattern formation method using the photoresist composition for an MMN coater.

It is still another object of the present invention to provide a liquid crystal display circuit containing a pattern formed by the method.

To attain the objects, the present invention provides a photoresist composition for a MMN coater comprising:

(a) 5 to 30 wt % of a polymer resin represented by the following Chemical Formula 1;

(b) 2 to 10 wt % of a diazide photoactive compound;

(c) 50 to 90 wt % of an organic solvent; and (d) 500 to 4000 ppm of a Si-based surfactant.

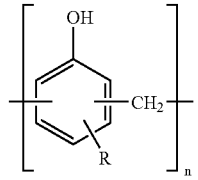

Chemical Formula 1

Here, R is $C_1$ to $C_4$ alkyl, and n is an integer of 15 10,000. Preferably, R is methyl.

The present invention also provides a pattern formation method comprising:

(a) a step of coating the photoresist composition on a substrate and drying it to prepare a photoresist film;

(b) a step of placing a patterned mask and exposing the photoresist film; and (c) a step of developing the exposed photoresist film to obtain a photoresist pattern.

The present invention also provides a semiconductor device containing a pattern formed by said method.

DETAILED DESCRIPTION OF THE PREFERRED EMBODIMENTS

Figure 1:
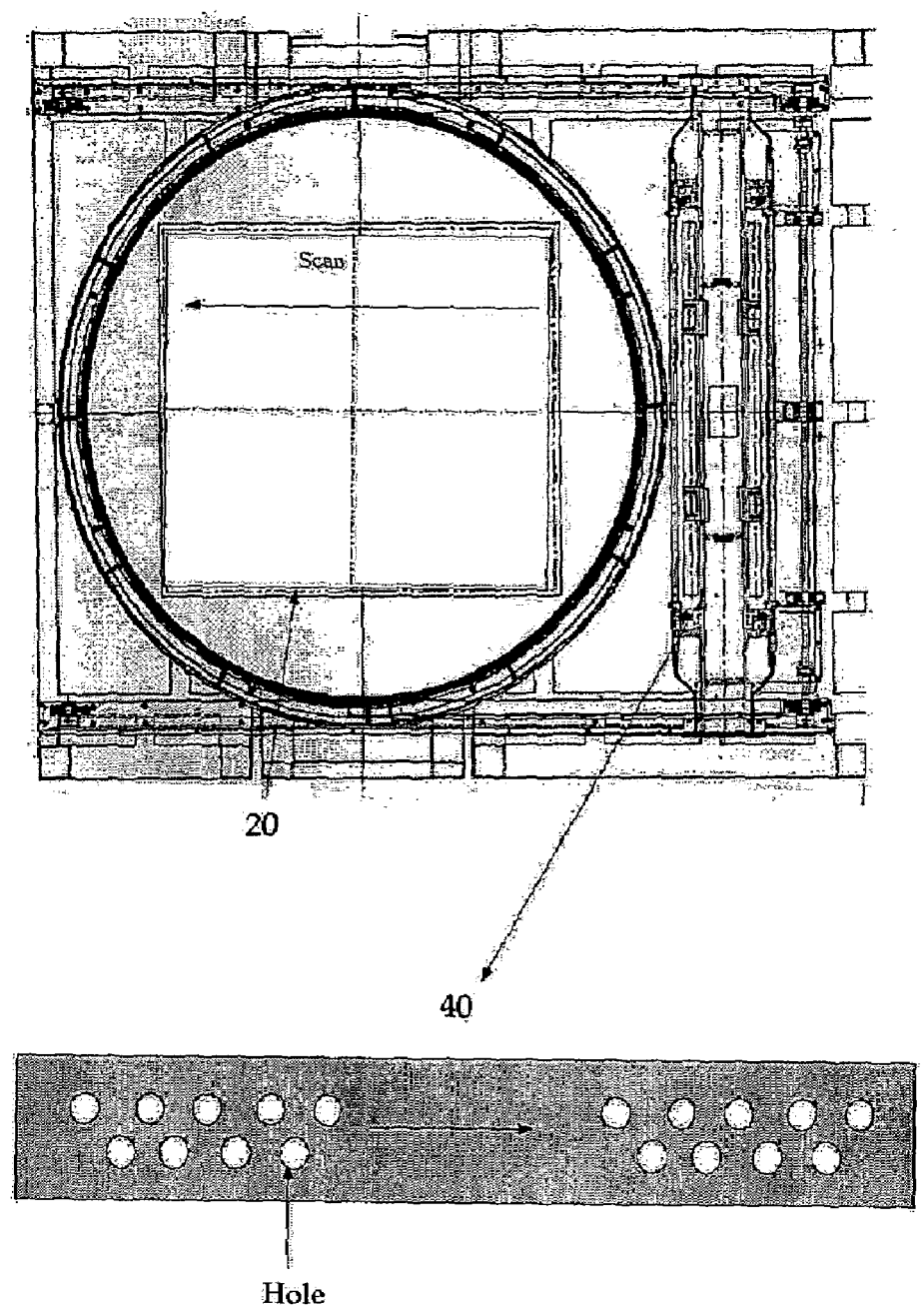
FIG. 1 is shows the coating method using an MMN head coater.
Figure 2:
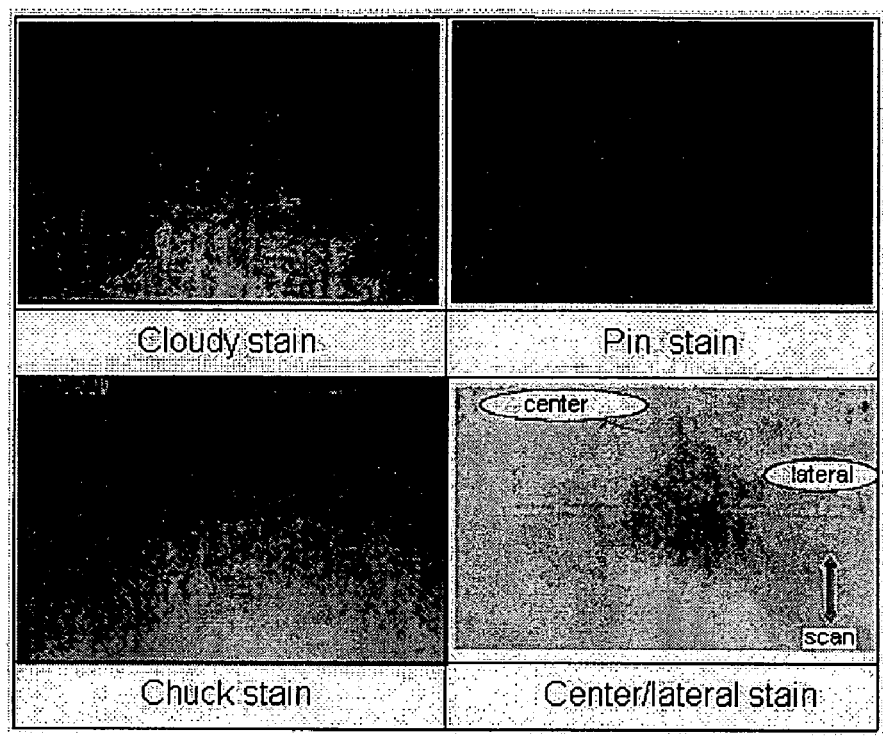
FIG. 2 shows the troublesome stains formed when using an MMN head coater.

Hereinafter, the present invention is described in more detail.

The present inventors developed a new photoresist composition suitable for an MMN head coater, which enables replacement of equipment and improvement of PR materials, by controlling composition and content of solvent and surfactant, in order to prevent stains and improve coating characteristics.

The present invention is characterized by a photoresist composition suitable for an MMN head coater for liquid crystal displays.

Preferably, the polymer resin of the photoresist composition of the present invention is a novolak resin represented by Chemical Formula 1. The novolak resin is prepared from condensation polymerization of a phenol compound and an aldehyde compound. For the phenol compound, phenol, m-cresol, p-cresol, and so forth can be used alone or in combination. For the aldehyde compound, formaldehyde, benzaldehyde, acetaldehyde, and so forth can be used. Any acidic catalyst can be used in the condensation polymerization of the phenol compound and the aldehyde compound. Preferably, the novolak resin has a molecular weight ranging from 2000 to 12,000.

The polymer resin is comprised at 5 to 30 wt %, more preferably in 10 to 20 wt %. If the polymer resin content is below 5 wt %, the viscosity is too low to obtain a coating with wanted thickness. Otherwise, if it exceeds 30 wt %, the viscosity is too high to obtain a uniform substrate.

In the photoresist composition for an MMN head coater of the present invention, a diazide compound is used for the photoactive compound (PAC).

The diazide photoactive compound can be prepared by reacting a diazide compound such as polyhydroxybenzophenone, 1,2-naphthoquinonediazide, and 2-diazo-1-naphthol-5-sulfonic acid. Preferably, 2,3,4,4'-tetrahydroxybenzophenone-1,2-naphthoquinonediazide-5-sulfonate prepared from esterification of tetrahydroxybenzophenone and 2-diazo-1-naphthol-5-sulfonic acid is used.

The photoactive compound is comprised at 2 to 10 wt %, preferably in 3 to 7 wt %. If the content of the photoactive compound is below 2 wt %, the photosensing rate becomes too fast, so the film remaining ratio becomes too low. Otherwise, if it exceeds 10 wt %, the photosensing rate becomes too slow.

The photoresist composition of the present invention comprises 50 to 90 wt % of an organic solvent. For the organic solvent, one or more solvents selected from a group consisting of propyleneglycol methyl ether (PGMEA), ethyl lactate (EL), 2-methoxyethyl acetate (MMP), n-butyl acetate (nBA), propyleneglycol monomethyl ether (PGME), and ethyl-3-ethoxy propionate (EEP) can be used alone or in combination. More preferably, a mixture solvent comprising 50 to 90 wt % of PGMEA and 10 to 50 wt % of EEP or butyl acetate (nBA) is used.

The photoresist composition of the present invention comprises a Si-based surfactant to minimize staining and improve coating characteristics.

Preferably, a polyoxyalkylene dimethylpolysiloxane copolymer is used for the Si-based surfactant. Preferably, the Si-based surfactant is comprised at 500 ppm to 4000 ppm.

The photoresist composition of the present invention may further comprise a nitrogen-containg crosslinking agent having an alkanol group of C1~C4, as an additive for crosslinking promotion of novolak resin used in polymer resin. The nitrogen-containing crosslinking agent used can be one or more selected from a group consisting of a condensation product of urea and formaldehyde, a condensation product of melamine and formaldehyde, a methylol urea alkyl aldehyde condensate, one of a methylol urea alkylether series, and one of a methylol melamine alkylether series. The content of the nitrogen-containing crosslinking agent used can be 2 to 35 weight parts, and more preferably 5 to 25 weight parts based on 100 weight parts of the photoresist composition. Therein, if the content of the nitrogen-containing crosslinking agent is below 2 weight parts, a sufficient crosslinking structure can not be obtained. Also, if it exceeds 35 weight parts, a thickness decrease of a non-exposure part becomes excessive.

The photoresist composition of the present invention may further comprise an additive such as a coloring agent, a dye, an anti-striation agent, a plasticizer, an adhesion promoter, and a surfactant, to improve processing characteristics, if required.

Hereinafter, a pattern formation method using the photoresist composition of the present invention is described in detail referring to the appended drawings.

The photoresist composition of the present invention is coated on a substrate using an MMN head coater to form a photoresist film (see FIG. 1). The photoresist composition may be spray-dispense coated (The PR is sprayed from a slit nozzle and then spun) or spin coated. Preferably, it is slit & spin coated. To take an example of using the spin coating method, the solid content of the photoresist composition may be modified depending on the spinning device and the spinning method to obtain a coating with wanted thickness.

The substrate may be either an insulation film or a conduction film. Any substrate to form a pattern, made of silicon, aluminum, indium tin oxide (ITO), indium zinc oxide (IZO), molybdenum, silicon dioxide, doped silicon dioxide, silicon nitride, tantalum, copper, polysilicon, ceramic, an aluminum/copper mixture, a variety of polymer resins, and so forth, can be used for the substrate.

The photoresist composition coated on the substrate is heated to 80 to 130° C. This process is called the soft bake process. This heat treatment is performed to evaporate the solvent without pyrolyzing the solid component of the photoresist composition. In general, it is recommended to minimize the solvent concentration through the soft bake process, and therefore the heat treatment is performed until most of the solvent evaporates. Especially, for a photoresist film for a liquid crystal display circuit, the soft bake process is performed until the thickness of the coating film decreases to below 2 μm.

Figure 3:
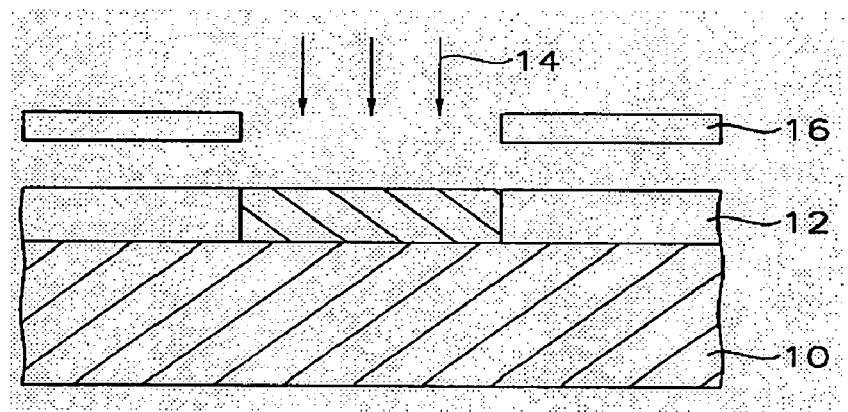
FIG. 3 and FIG. 4 show the pattern formation process using the photoresist of the present invention.

The substrate 10 on which the photoresist film 12 is formed is selectively exposed to light, particularly a UV light 14, using a suitable mask or template 16 (see FIG. 3).

Figure 4:
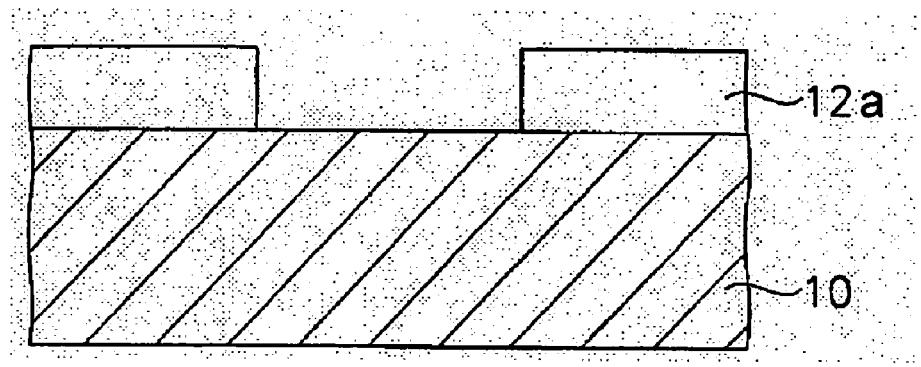

The exposed substrate 10 is dipped in an alkaline developing solution and let alone until all or most of the exposed part of the photoresist film is dissolved (see FIG. 4). For the developing solution, an aqueous solution containing an alkali oxide, ammonium hydroxide, or tetramethylammonium hydroxide can be used.

The substrate of which the exposed part is removed by dissolving in the developing solution may be heat-treated again to improve its adhesivity to the photoresist film and chemical resistance. This process is called the hard bake process. This heat treatment is performed at a temperature below the softening point of the photoresist film, preferably in the range of 90 to 140° C. When the heat treatment is finished, the wanted photoresist pattern 12a is formed.

Next, the substrate on which the photoresist pattern 12a is formed is treated with a corrosive solution or a gas plasma. In the process, the non-exposed part of the substrate is protected by the photoresist pattern. Then, the photoresist pattern is removed using an appropriate stripper to form a micro circuit pattern having a desired design is obtained on the substrate.

The photoresist composition of the present invention improves the uniformity of the photoresist film and solves the stain problem, so that it can be used for a variety of semiconductor devices, including liquid crystal displays.

Hereinafter, the present invention is described in more detail through Examples and Comparative Examples. However, the following Examples are only for the understanding of the present invention, and the present invention is not limited by the following Examples.

EXAMPLES

Preparation Example

Preparation of m-/p-novolak Resin 45 g of m-cresol, 55 g of p-cresol, 65 g of formaldehyde, and 0.5 g of oxalic acid were put in an overhead stirrer and stirred to obtain a homogeneous mixture. The reaction mixture was heated to 95° C., and this temperature was maintained for 4 hours. The reflux condenser was replaced by a distiller, and the reaction mixture was distilled at 110° C. for 2 hours. Vacuum distillation was performed at 180° C. for 2 hours to remove remaining monomers, and the melt novolak resin was cooled to room temperature. The number-average molecular weight of the novolak resin was determined by GPC to be 3,500 (based on polystyrene).

Example 1

5 g of 2,3,4,4-tetrahydroxybenzophenone-1,2-naphthoquinonediazide-5-sulfonate (sensitizer), 21 g of the novolak resin prepared in Preparation Example 1 (polymer resin), 74 g of a 50/50 mixture of PGMEA/nBA (organic solvent), and 500 ppm of a polyoxyalkylene dimethylpolysiloxane copolymer (Si-based surfactant) were put in a reactor equipped with a cooling tube and a stirrer. The mixture was stirred at 40 rpm at room temperature to prepare a photoresist composition.

The prepared photoresist composition was dripped on a 0.7T (thickness, 0.7 mm) glass substrate. The glass was rotated at a constant rate, and then dried by heating at 115° C. for 90 seconds to form a film with a thickness of 1.50 μm. A patterned mask was placed on the film and a UV light was illuminated thereon. The substrate was then dipped in a 2.38% aqueous solution of tetramethylammonium hydroxide for 60 seconds to remove the part exposed to UV light and form a photoresist pattern.

Example 2

The procedure of Example 1 was carried out using a 50/50 mixture of PGMEA/EEP as an organic solvent.

Example 3

The procedure of Example 2 was carried out with an increased surfactant amount of 500 ppm.

Comparative Example 1

A commonly used LCD photoresist composition was used to form a photoresist pattern. The photoresist composition comprised the conventional novolak resin, a DNQ PAC, an organic solvent, and an F-based surfactant.

Comparative Example 2

A photoresist pattern was formed by using a photoresist composition having a good sensitivity.

Test Example

The film thickness uniformity and cloudy stain were evaluated for Examples 1 to 3 and Comparative Examples 1 and 2.

a. Evaluation of Central Stains and Film Thickness Uniformity (Coating Uniformity)

Figure 5:
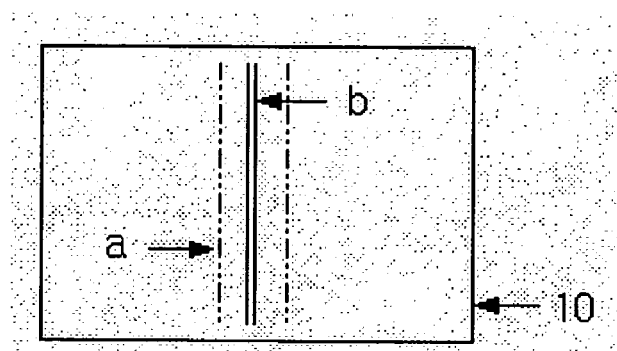
FIG. 5 shows the central stain formed when using an MMN head coater.

Stains formed at the center of the glass were vague lines and clear lines (see FIG. 5).

The film thickness uniformity was about ±2% for each coated film thickness. The film thickness uniformity was calculated by the following equation. The results are shown in Table 1 below.

$$\text{Film thickness uniformity (\%)} = [(\text{Maximum thickness} - \text{Minimum thickness})/(\text{Maximum thickness} + \text{Minimum thickness})] \times 100 \quad \text{Equation 1}$$

TABLE 1

|  | Vague line (μm) | Clear line (μm) | Film thickness uniformity (%) |
|---|---|---|---|
| Comparative Example 1 | 80 | 48 | 2.8 |
| Comparative Example 2 | 70 | 55 | 2.4 |
| Example 1 | — | 80 | 2.87 |
| Example 2 | 80 | — | 2.22 |
| Example 3 | 60 | — | 2.4 |

As can be seen in Table 1, the photoresist films formed using the photoresist compositions prepared in Examples 1 to 3 had comparable or better film thickness uniformity (coating uniformity) compared to those of Comparative Examples 1 and 2.

Also, in view of the central stains, vague lines of Examples 2 and 3 were comparable to those of Comparative Examples 1 and 2, and importantly, there was no clear line. The values in μm units are minimum PR film thickness when no vague line or clear line is seen. The minimum PR film thickness refers to the PR film thickness formed on the glass after coating and before baking. That is, the smaller the minimum PR film thickness, the less PR is sprayed from the MMN head coater to the glass, which contributes to economical advantage.

b. Evaluation of Cloudy Stain

Figure 6A:
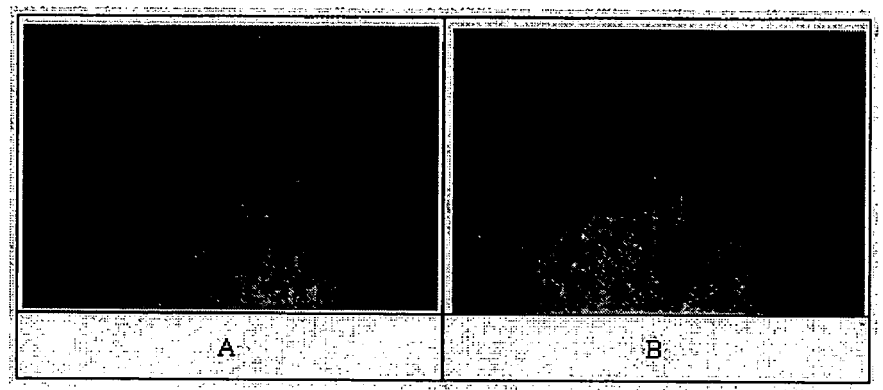
FIG. 6a shows the cloudy stain after pattern formation using the photoresist compositions of Comparative Examples 1 and 2.
Figure 6B:
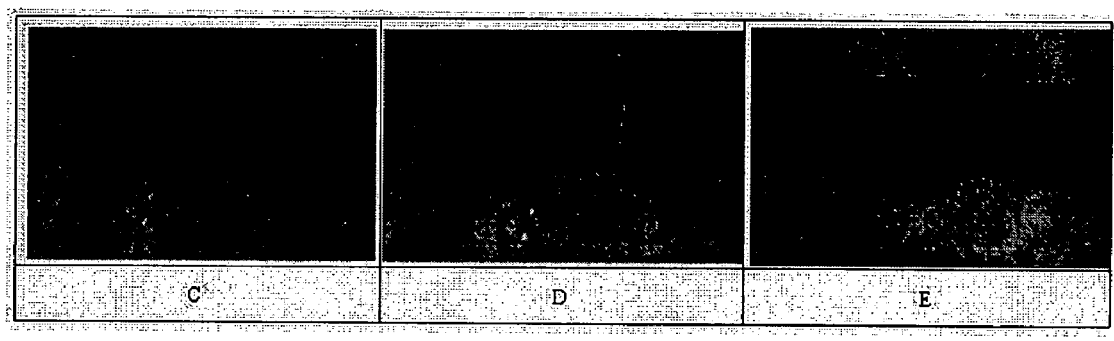
FIG. 6b shows the cloudy stain after pattern formation using the photoresist compositions of Examples 1 to 3.

The cloudy stain evaluation result is shown in FIG. 6a (Comparative Examples 1 and 2) and FIG. 6b (Examples 1 to 3). Comparative Examples 1 and 2 are marked as A and B respectively, and Examples 1 to 3 are marked as C, D, and E respectively.

From the cloudy stain evaluation result, it can be seen that the photoresist composition of Example 3 (E) is best. This is because the amount of the Si-based surfactant was increased.

As mentioned above, Example 3 showed the best result. This seems to be caused by the synergic effect of the PGMEA/EEP solvent system and Si-based surfactant.

As described above, the photoresist composition for liquid crystal display circuits of the present invention solves the stain problem which occurs in MMN head coaters used for large-scale substrate glass, and improves coating characteristics, so that it can be utilized industrially and is expected to significantly improve productivity.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method for forming a photoresist pattern on a large-scale substrate, comprising:
   applying a photoresist composition to the large-scale substrate with a multi-micro nozzle (MMN) head coater, drying the photoresist composition applied to the large-scale substrate to prepare a photoresist film;

placing a patterned mask over the photoresist film and substrate and exposing the photoresist film to light; and developing the exposed photoresist film to obtain a photoresist pattern;

wherein the photoresist composition comprises:

(a) 5 wt % to 30 wt % of a polymer resin represented by the following Chemical Formula 1;

(b) 2 wt % to 10 wt % of a diazide photoactive compound;

(c) 50 wt % to 90 wt % of an organic solvent; and (d) 500 to 4000 ppm of a Si based surfactant:

Chemical Formula 1

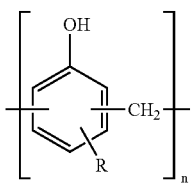

wherein R is $C_1$ to $C_4$ alkyl, and n is an integer of 15 to 10,000, and wherein the Si-based surfactant is a polyoxyalkylene dimethylpolysiloxane copolymer compound, wherein the composition and content of solvent and surfactant is controlled to prevent stains and improve coating characteristics in a photoresist film formed on the substrate from the photoresist composition, and wherein stains include central stains, lateral stains, or cloudy stains.

2. The method of claim 1, wherein the polymer resin is a novolak resin having a molecular weight ranging from about 2000 to 12,000.

3. The method of claim 1, wherein the organic solvent is one or more substances selected from the group consisting of propyleneglycol methyl ether acetate (PGMEA), ethyl lactate (EL), 2-methoxyethylacetate (MMP), n-butyl acetate (nBA), propyleneglycol monomethyl ether (PGME), and ethyl-3-ethoxypropionate (EEP).

4. The method of claim 1, wherein the organic solvent is a mixture of 50 wt % to 90 wt % of propyleneglycol methyl ether acetate (PGMEA) and 10 wt % to 50 wt % of ethyl-3-ethoxypropionate (EEP).

5. The method of claim 1, wherein the polymer resin is a novolak resin having a molecular weight ranging from about 2,000 to 12,000, and the organic solvent comprises one or more substances selected from the group consisting of propyleneglycol methyl ether acetate (PGMEA), ethyl lactate (EL), 2-methoxyethylacetate (MMP), n-butyl acetate (nBA), propyleneglycol monomethyl ether (PGME), and ethyl-3-ethoxypropionate (EEP)

wherein the organic solvent is a mixture of 50 wt % to 90 wt % of propyleneglycol methyl ether acetate (PGMEA) and 10 wt % to 50 wt % of ethyl-3-ethoxypropionate (EEP).

6. The method of claim 1, wherein the photoresist composition further comprises one or more nitrogen-containing crosslinking agents selected from the group consisting of a condensation product of urea and formaldehyde, a condensation product of melamine and formaldehyde, a methylol urea alkyl aldehyde condensate, a methylol urea alkylether, and a methylol melamine alkylether.

7. The method of claim 1, wherein applying the photoresist composition is by the spray dispense method or the spin coating method.

8. The method of claim 1, which is applied to liquid crystal display circuits having a large-scale substrate glass.

9. A method to prevent stains in a photoresist film applied to a large-scale substrate by a multi-micro nozzle (MMN) head coater, comprising applying a photoresist composition to the large-scale substrate with the MMN head coater by spray-dispense coating and spinning, wherein the photoresist composition comprises:

(a) 5 wt % to 30 wt % of a polymer resin represented by the following Chemical Formula 1;

(b) 2 wt % to 10 wt % of a diazide photoactive compound;

(c) 50 wt % to 90 wt % of an organic solvent; and (d) 500 to 4000 ppm of a Si based surfactant:

Chemical Formula 1

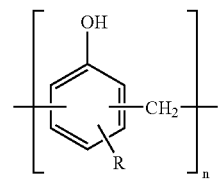

wherein R is $C_1$ to $C_4$ alkyl, and n is an integer of 15 to 10,000, wherein the Si-based surfactant is a polyoxyalkylene dimethylpolysiloxane copolymer compound, the organic solvent is a mixture of 50 wt % to 90 wt % of propyleneglycol methyl ether acetate (PGMEA) and 10 wt % to 50 wt % of ethyl-3-ethoxypropionate (EEP), and the composition and content of solvent and surfactant is controlled to prevent stains and improve coating characteristics in the photoresist film formed on the substrate from the photoresist composition, and wherein stains include central stains, lateral stains, or cloudy stains.

* * * * *